(12) United States Patent
Molnar et al.

(10) Patent No.: US 10,154,603 B2
(45) Date of Patent: Dec. 11, 2018

(54) INPUT/OUTPUT MODULE BUS CONTACT SYSTEM AND METHOD

(71) Applicant: Rockwell Automation Technologies, Inc., Mayfield Heights, OH (US)

(72) Inventors: Nathan J. Molnar, Shaker Heights, OH (US); David S. Wehrle, Chesterland, OH (US); Douglas R. Bodmann, Shaker Heights, OH (US); Robert J. Hager, Windsor, OH (US); Joseph G. Vazach, Mentor, OH (US); Robert J. Kretschmann, Bay Village, OH (US); Gregg M. Sichner, Mentor, OH (US); Douglas A. Lostoski, Richfield, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 635 days.

(21) Appl. No.: 14/716,697

(22) Filed: May 19, 2015

(65) Prior Publication Data
US 2015/0253754 A1 Sep. 10, 2015

Related U.S. Application Data

(63) Continuation of application No. 13/213,991, filed on Aug. 19, 2011, now Pat. No. 9,077,108.
(Continued)

(51) Int. Cl.
| | |
|---|---|
| *H05K 7/14* | (2006.01) |
| *G05B 15/02* | (2006.01) |
| *H01R 13/62* | (2006.01) |
| *G06F 9/445* | (2018.01) |
| *G06F 13/10* | (2006.01) |

(Continued)

(52) U.S. Cl.
CPC .......... *H05K 7/1468* (2013.01); *G05B 15/02* (2013.01); *G05B 19/054* (2013.01);
(Continued)

(58) Field of Classification Search
None
See application file for complete search history.

(56) References Cited

U.S. PATENT DOCUMENTS

| 741,052 A | 10/1903 | Mahon |
| 3,786,392 A * | 1/1974 | McDaniel ............ H01R 13/652 |
| | | 439/103 |

(Continued)

*Primary Examiner* — Jared Fureman
*Assistant Examiner* — Joel Barnett
(74) *Attorney, Agent, or Firm* — Fletcher Yoder P.C.

(57) ABSTRACT

Present embodiments include an automation control system that includes an input/output device module with a device bus therein. The input/output module also includes a first bus contact on a first side of the input/output device module and communicatively coupled with a first end of the device bus, and a second bus contact on a second side of the input/output device module and communicatively coupled with a second end of the device bus. The second side generally faces an opposite direction from the first side and the input/output device module is configured to be coupled with additional input/output device modules positioned on the first and second sides of the input/output device module via the first and second bus contacts. Further, the first and second bus contacts are positioned on non-lateral surfaces of the input/output device module, the first and second contacts include spring-loaded connectors, the first and second contacts include two-prong or three-prong forks, or the input/output device module is a terminal block.

16 Claims, 7 Drawing Sheets

Related U.S. Application Data

(60) Provisional application No. 61/375,587, filed on Aug. 20, 2010.

(51) Int. Cl.
*H01R 13/629* (2006.01)
*H01R 13/635* (2006.01)
*G05B 19/05* (2006.01)

(52) U.S. Cl.
CPC ....... *G05B 19/056* (2013.01); *G06F 9/44505* (2013.01); *G06F 13/10* (2013.01); *H01R 13/62* (2013.01); *H01R 13/629* (2013.01); *H01R 13/635* (2013.01); *H05K 7/1474* (2013.01); *H05K 7/1484* (2013.01); *G05B 2219/21092* (2013.01); *G05B 2219/25314* (2013.01); *G05B 2219/25452* (2013.01); *Y10T 29/49117* (2015.01); *Y10T 307/937* (2015.04)

(56) References Cited

U.S. PATENT DOCUMENTS

| | | | |
|---|---|---|---|
| 4,711,510 A * | 12/1987 | Orlando, Jr. | H01R 13/625 439/246 |
| 4,820,182 A | 4/1989 | Harwath et al. | |
| 5,035,639 A | 7/1991 | Kilpatrick et al. | |
| 5,098,311 A | 3/1992 | Roath et al. | |
| 5,483,229 A | 1/1996 | Tamura et al. | |
| 5,493,194 A | 2/1996 | Damiano et al. | |
| 5,629,831 A | 5/1997 | Eggert et al. | |
| 5,716,241 A * | 2/1998 | Hennemann | G06F 1/184 439/716 |
| 5,775,955 A * | 7/1998 | Graube | H01R 9/2408 439/716 |
| 5,899,753 A | 5/1999 | Wong et al. | |
| 6,175,932 B1 | 1/2001 | Foote et al. | |
| 6,816,919 B2 | 11/2004 | Gareis et al. | |
| 7,125,281 B2 | 10/2006 | Sweetland | |
| 7,607,929 B1 * | 10/2009 | Nguyen | H01R 13/6315 439/246 |
| 7,666,004 B2 * | 2/2010 | Johnson | H05K 7/1467 439/76.1 |
| 8,055,814 B2 | 11/2011 | Sichner et al. | |
| 9,024,486 B2 | 5/2015 | Wehrle et al. | |
| 2012/0043378 A1 | 2/2012 | Vazach et al. | |
| 2012/0044082 A1 | 2/2012 | Molnar et al. | |
| 2012/0044083 A1 | 2/2012 | Molnar et al. | |
| 2012/0045913 A1 | 2/2012 | Bodmann et al. | |
| 2012/0047288 A1 | 2/2012 | Kretschmann et al. | |

\* cited by examiner

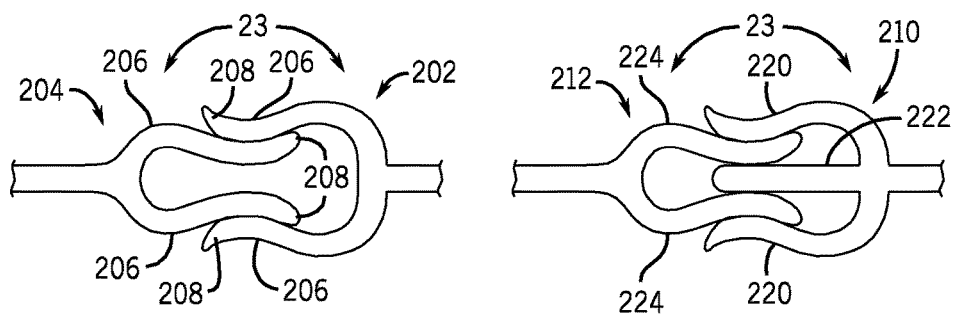
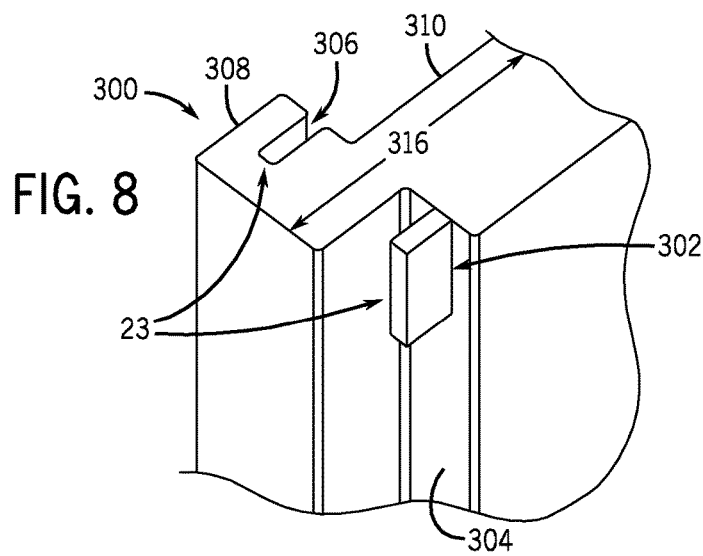
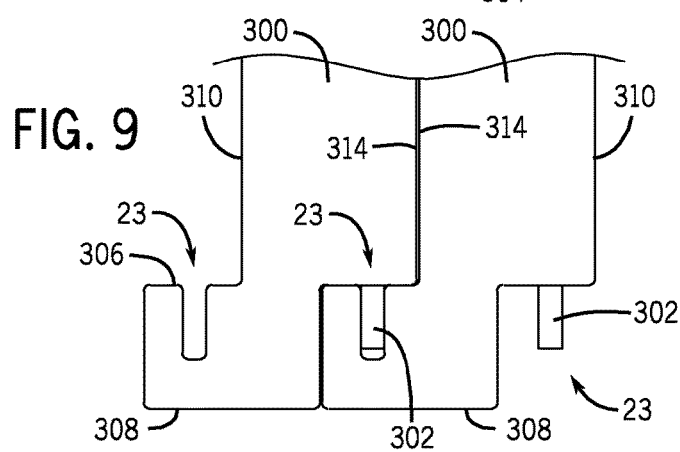

INPUT/OUTPUT MODULE BUS CONTACT SYSTEM AND METHOD

CROSS REFERENCE TO RELATED APPLICATIONS

This application claims priority of U.S. Provisional Patent Application No. 61/375,587, filed Aug. 20, 2010, and U.S. patent application Ser. No. 13/213,991, filed Aug. 19, 2011, each of which is herein incorporated in its entirety by reference.

BACKGROUND

The invention relates generally to the field of automation control systems, such as those used in industrial and commercial settings. More particularly, embodiments of the present invention relate to techniques for providing, accessing, configuring, operating, and interfacing with configurable modular devices, such as configurable input/output (I/O) devices, that are capable of coupling and interfacing with an automation controller in a modular automation control system.

Automation controllers are special purpose computers used for controlling industrial automation and the like. Under the direction of stored programs, a processor of the automation controller examines a series of inputs (e.g., electrical input signals to the automation controller) reflecting the status of a controlled process, and changes outputs (e.g., electrical output signals from the automation controller) based on analysis and logic for affecting control of the controlled process. The stored control programs may be continuously executed in a series of execution cycles, executed periodically, or executed based on events.

The automation controller may function with other modular components of a control system to facilitate control or monitoring of a particular process. For example, inputs received by the automation controller from the controlled process and the outputs transmitted by the automation controller to the controlled process are normally passed through one or more I/O devices, which are components of the associated automation control system. The I/O devices generally serve as an electrical interface between the automation controller and the controlled process. Specifically, such I/O devices typically include a base configured to communicatively couple with a bus bar or the like (such that electrical signals can be transmitted therebetween), a terminal block with terminals or channels for connecting with wiring from field devices, and an I/O module that facilitates communication of information from the field devices to other automation controller components.

Traditional automation control systems receive power from a power source (e.g., an electrical grid or battery) through field power distribution (FPD) modules, which are specialized modules for providing power to components of the automation control system. This power is then distributed throughout the system by integral bus features. For example, I/O devices typically share this power with other modules of the automation control system via a device power bus. Similarly, data is typically transmitted between system components via a device data bus. Indeed, each I/O device typically includes an internal device power bus and/or data bus that couples with other device buses via system electrical contacts extending from a side of a base module of the respective I/O device. It is now recognized that due to traditional characteristics and/or placement of electrical contacts for such device power buses, it can be difficult to communicatively couple and access I/O devices and device components. Accordingly, it is desirable to provide a more efficient process and system for providing power distribution that facilitates system configuration.

BRIEF DESCRIPTION

The present invention is directed to an automation control system that includes an input/output device module having an integral device bus. The input/output module also includes a first bus contact on a first side of the input/output device module and communicatively coupled with a first end of the device bus, and a second bus contact on a second side of the input/output device module and communicatively coupled with a second end of the device bus. The second side generally faces an opposite direction from the first side and the input/output device module is configured to be coupled with additional input/output device modules positioned on the first and second sides of the input/output device module via the first and second bus contacts. Further, the first and second bus contacts are positioned on non-lateral surfaces of the input/output device module, the first and second contacts include spring-loaded connectors, the first and second contacts include two-prong or three-prong forks, or the input/output device module is a terminal block.

DRAWINGS

These and other features, aspects, and advantages of the present invention will become better understood when the following detailed description is read with reference to the accompanying drawings in which like characters represent like parts throughout the drawings, wherein:

FIG. 6 illustrates a pair of bus contacts including two-prong forks in accordance with embodiments of the present techniques.

FIG. 7 illustrates a pair of bus contacts including a two-prong fork and a three-prong fork in accordance with embodiments of the present techniques.

FIG. 8 is a perspective view of an I/O device module including bus contacts on non-lateral surfaces in accordance with embodiments of the present techniques.

FIG. 9 is a top view of a pair of I/O device modules coupled together via bus contacts on non-lateral surfaces in accordance with embodiments of the present techniques.

DETAILED DESCRIPTION

Figure 1:
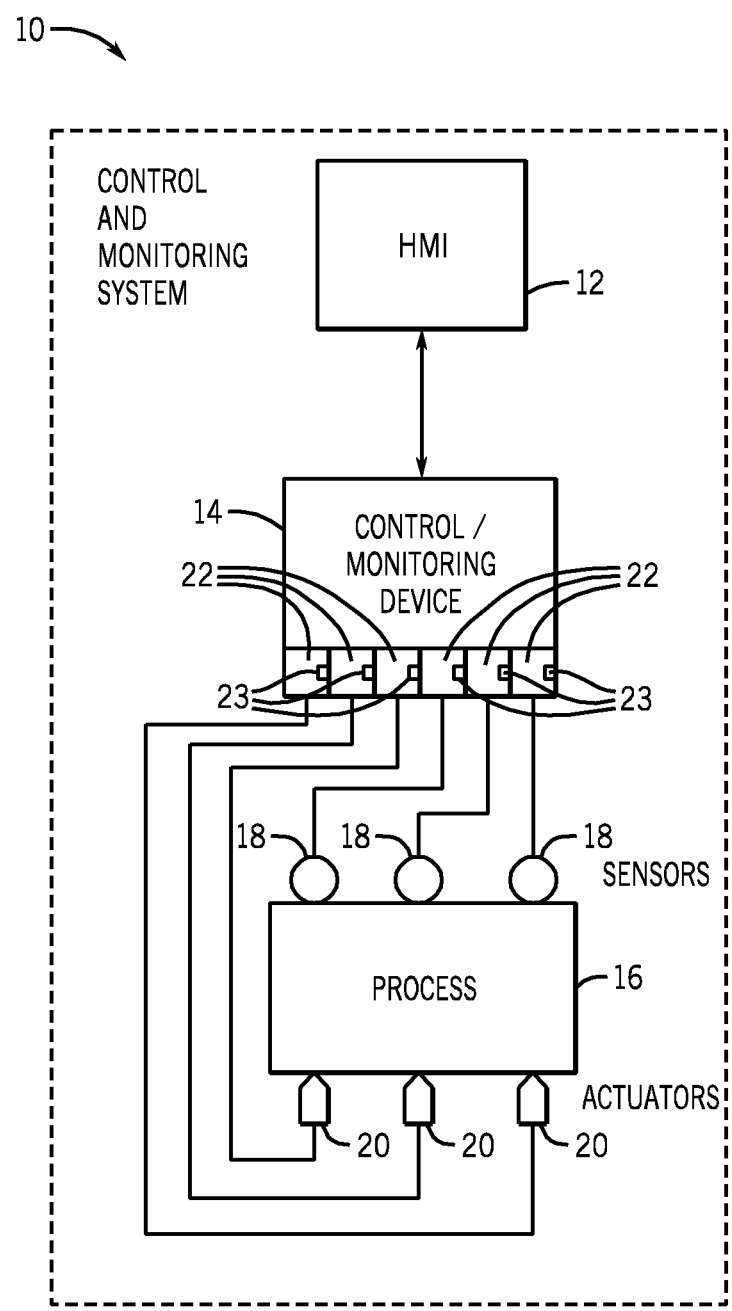
FIG. 1 is a diagrammatical representation of an exemplary control and monitoring system or automation controller system adapted to interface with networked components and configuration equipment in accordance with embodiments of the present techniques.

FIG. 1 is a diagrammatical representation of an exemplary control and monitoring system or automation controller system adapted to interface with networked components and configuration equipment in accordance with embodiments of the present techniques. The control and monitoring system of FIG. 1 includes I/O devices that incorporate device power buses with externally accessible contacts in accordance with present techniques. These device power bus contacts, which may be referred to herein as bus contacts, include bus contacts that are positioned on certain modular components of an I/O device, bus contacts that are oriented on non-lateral surfaces of an I/O device to facilitate coupling with bus contacts of other I/O devices, and bus contacts with specific coupling characteristics in accordance with present techniques. For example, present embodiments include bus contacts disposed on a removable terminal block module of an I/O device, bus contacts that use spring loaded ball contacts or unique prong arrangements, and contacts with mating features positioned on a front-facing panel or face of the I/O device.

In FIG. 1, the control and monitoring system is generally indicated by reference numeral 10. Specifically, the control and monitoring system 10 is illustrated as including a human machine interface (HMI) 12 and a control/monitoring device or automation controller 14 adapted to interface with components of a process 16. It should be noted that such an interface in accordance with embodiments of the present techniques may be facilitated by the use of certain network strategies. Indeed, an industry standard network may be employed, such as DeviceNet, to enable data transfer. Such networks permit the exchange of data in accordance with a predefined protocol, and may provide power for operation of networked elements.

The process 16 may take many forms and include devices for accomplishing many different and varied purposes. For example, the process 16 may comprise a compressor station, an oil refinery, a batch operation for making food items, a mechanized assembly line, and so forth. Accordingly, the process 16 may comprise a variety of operational components, such as electric motors, valves, actuators, temperature elements, pressure sensors, or a myriad of manufacturing, processing, material handling and other applications. Further, the process 16 may comprise control and monitoring equipment for regulating process variables through automation and/or observation. For example, the illustrated process 16 comprises sensors 18 and actuators 20. The sensors 18 may comprise any number of devices adapted to provide information regarding process conditions. The actuators 20 may include any number of devices adapted to perform a mechanical action in response to a signal from a controller (e.g., the automation controller 14). The sensors 18 and actuators 20 may be utilized to operate process equipment. Indeed, they may be utilized within process loops that are monitored and controlled by the control/monitoring device 14 and/or the HMI 12. Such a process loop may be activated based on process inputs (e.g., input from a sensor 18) or direct operator input received through the HMI 12.

As illustrated, the sensors 18 and actuators 20 are in communication with the control/monitoring device 14. Further, the sensors 18 and actuators 20 may be assigned a particular address in the control/monitoring device 14 and receive power from the control/monitoring device 14 or attached devices. As illustrated, the sensors 18 and actuators 20 may communicate with the control/monitoring device 14 via one or more I/O devices 22 coupled to the control/monitoring device 14. The I/O devices 22 may transfer input and output signals between the control/monitoring device 14 and the controlled process 16. The I/O devices 22 may be integrated with the control/monitoring device 14, or may be added or removed via expansion slots, bays or other suitable mechanisms. For example, as described in greater detail below, additional I/O devices 22 may be added to add functionality to the control/monitoring device 14. Indeed, if new sensors 18 or actuators 20 are added to control the process 16, additional I/O devices 22 may be added to accommodate and incorporate the new features functionally with the control/monitoring device 14. The I/O devices 22 serve as an electrical interface to the control/monitoring device 14 and may be located proximate or remote from the control/monitoring device 14, including remote network interfaces to associated systems. In the illustrated embodiment, the I/O devices 22 include coupling features or bus contacts 23 that include unique characteristics or that are positioned to facilitate accessibility and operation in accordance with present embodiments. It should be noted that the bus contacts 23 may be representative of a single coupling feature (e.g., prongs) and/or a pair of corresponding coupling features (e.g., prongs and a mating receptacle or other mating prongs).

The I/O devices 22 may include input modules that receive signals from input devices such as photo-sensors and proximity switches, output modules that use output signals to energize relays or to start motors, and bidirectional I/O modules, such as motion control modules which can direct motion devices and receive position or speed feedback. In some embodiments, the I/O devices 22 may convert between AC and DC analog signals used by devices on a controlled machine or process and DC signals used by the control/monitoring device 14. Additionally, some of the I/O devices 22 may provide digital signals to digital I/O devices and receive digital signals from digital I/O devices. Further, in some embodiments, the I/O devices 22 that are used to control machine devices or process control devices may include local microcomputing capability on an I/O module of the I/O devices 22.

In some embodiments, the I/O devices 22 may be located in close proximity to a portion of the control equipment, and away from the remainder of the control/monitoring device 14. In such embodiments, data may be communicated with remote modules over a common communication link, or network, wherein modules on the network communicate via a standard communications protocol. Many industrial controllers can communicate via network technologies such as Ethernet (e.g., IEEE802.3, TCP/IP, UDP, EtherNet/IP, and so forth), ControlNet, DeviceNet or other network protocols (Foundation Fieldbus (H1 and Fast Ethernet) Modbus TCP, Profibus) and also communicate to higher level computing systems.

Figure 2:
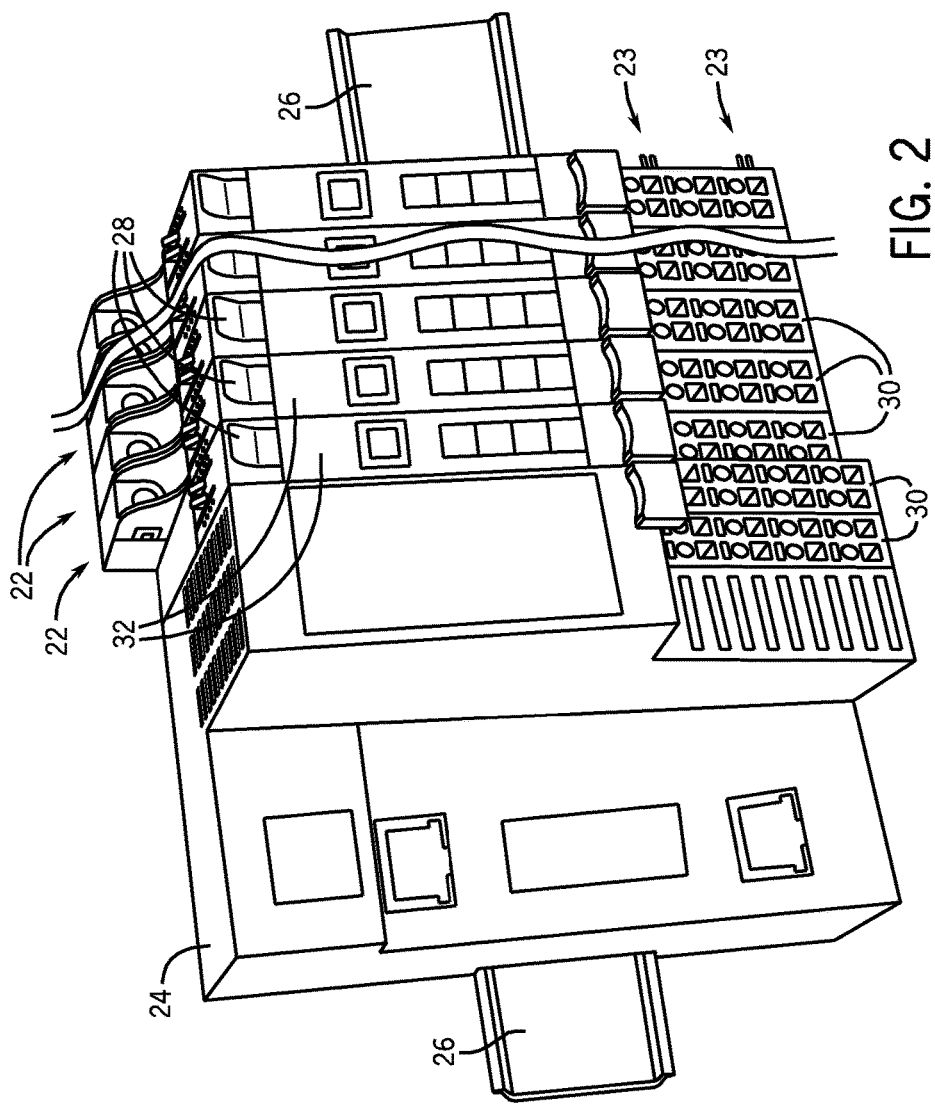
FIG. 2 is a perspective view of a plurality of I/O devices communicatively or electrically coupled together and with an I/O adapter in accordance with embodiments of the present techniques.

FIG. 2 is a perspective view of a plurality of I/O devices 22 connected to an I/O adapter 24 in accordance with embodiments of the present techniques. The I/O devices 22 and the I/O adapter 24 are each coupled with a DIN rail 26. Further, each I/O device 22 includes a base 28 that directly couples with the DIN rail 26, a terminal block 30 that facilitates communicative coupling with field wiring, and an I/O module 32 configured to provide functionality. The I/O adapter 24 is configured to provide system power to the I/O devices 22, as well as to enable conversion between the communications protocols of the I/O devices 22 and the control/monitoring device 14. The I/O devices 22 share power from the I/O adapter 24 via device power buses of each I/O device 22 that are coupled together via the bus contacts 23 to form a combined device power bus in accordance with present embodiments. In some embodiments, the I/O devices 22 may also include field power buses that couple via the bus contacts 23 to facilitate provision of power to field devices. Similarly, the I/O devices share data through device data buses of each I/O device 22 that are coupled together via the bus contacts 23 to form a combined device data bus in accordance with present embodiments. In the illustrated embodiment of FIG. 2, the bus contacts 23 (e.g., spring-loaded ball contacts) are extending from the terminal block 30. However, in other embodiments the bus contacts 23 may be located on one or more components of the I/O devices 22 and may include various different types of coupling features (e.g., triple-prong mating features or spring-loaded ball contacts) in accordance with present techniques.

As illustrated, the I/O adapter 24 and the plurality of I/O devices 22 are mounted to the DIN rail 26, which is an industry standard support rail for mounting control equipment in racks and cabinets. As described in greater detail below, the plurality of I/O devices 22 are electrically coupled in series along the DIN rail 26 such that field power and system information and power may be communicated between the I/O devices 22, and back through the I/O adapter 24 to the control/monitoring device 14. In other embodiments, the DIN rail 26 may be replaced with a different type of system mounting structure.

Each of the I/O devices 22 includes a corresponding base 28 for physically and communicatively connecting the I/O device 22 to the DIN rail 26, the I/O adapter 24, and/or adjacent I/O devices 22. In addition, the base 28 of the I/O device 22 may be configured to physically and communicatively connect the I/O device 22 with field and system electrical contacts (e.g., bus contacts 23), other base connection features, and so forth. In some embodiments, the base 28 includes the bus contacts 23. In addition, the base 28 includes or is configured to be coupled with a corresponding terminal block 30. Indeed, each of the I/O devices 22 in FIG. 2 includes a corresponding terminal block 30 (which, in certain embodiments, may be removable from the base 28) for electrically connecting the I/O device 22 to field devices, such as the sensors 18 and actuators 20 illustrated in FIG. 1. In certain embodiments, each terminal block 30 may include the bus contacts 23. Furthermore, each of the I/O devices 22 includes one or more I/O modules 32, which include I/O control circuitry and/or logic. In general, the I/O modules 32 receive input signals from the field devices, deliver output signals to the field devices, perform general and/or specific local functionality on the inputs and/or outputs, communicate the inputs and/or outputs to the control/monitoring device 14 and/or the other I/O devices 22, and so forth. As with the other components of the I/O devices 22, the I/O modules 32 may include the bus contacts 23.

Figure 3:
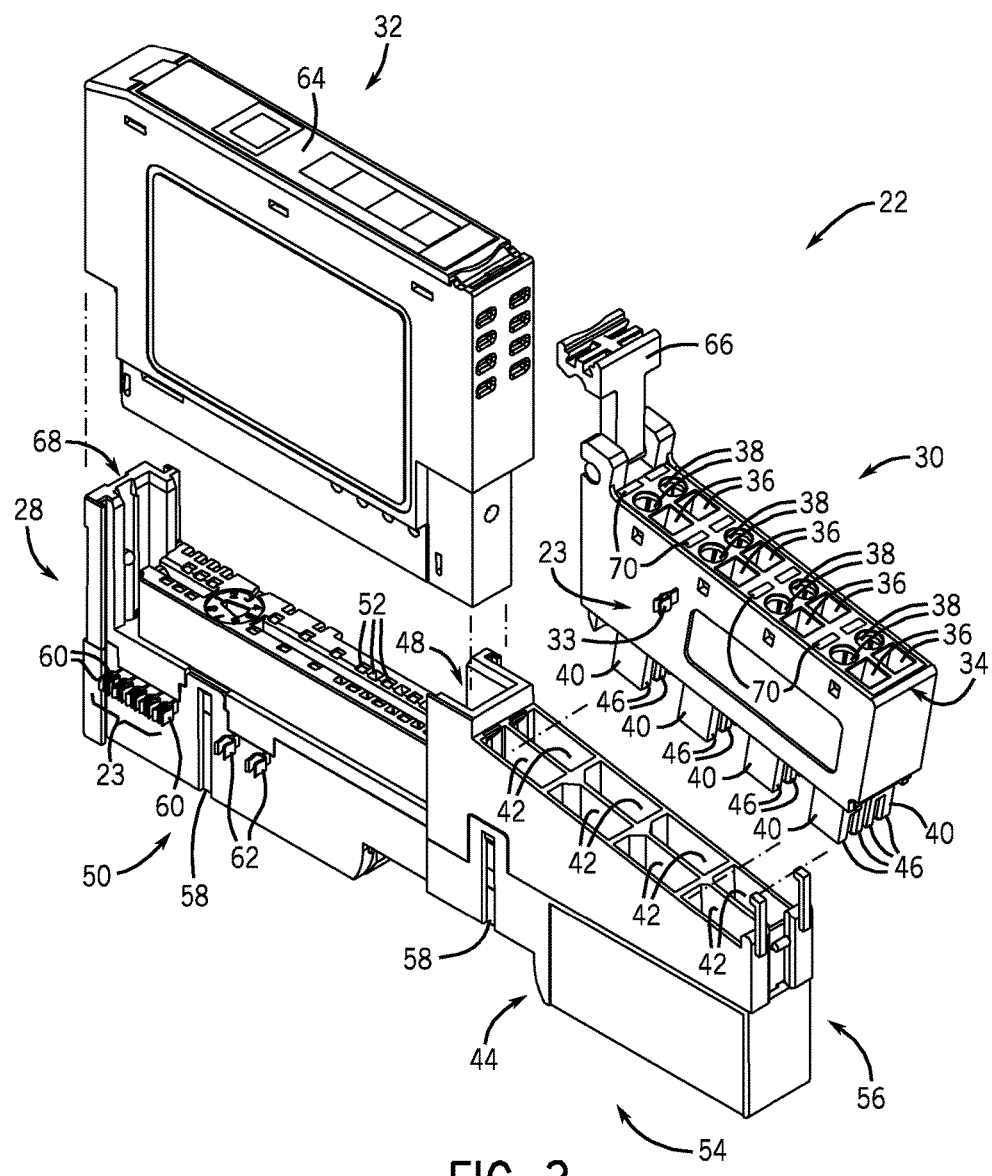
FIG. 3 is an exploded perspective view of an exemplary I/O device in accordance with embodiments of the present techniques.
Figure 4:
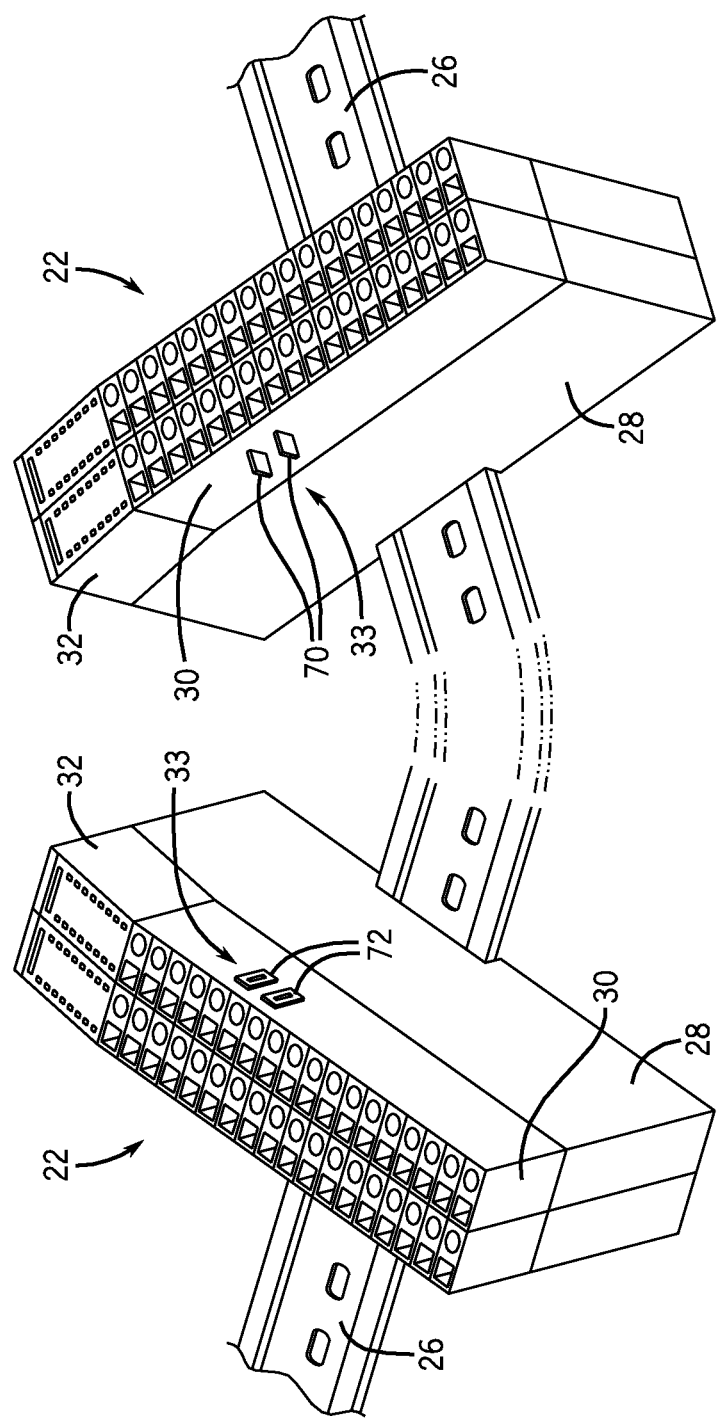
FIG. 4 is a perspective view of a pair of I/O devices with terminal blocks including corresponding bus contacts in accordance with embodiments of the present techniques.

FIG. 3 is an exploded perspective view of an exemplary I/O device 22 that includes both the terminal block 30 and base 28 having bus contacts 23 in accordance with embodiments of the present techniques. The bus contacts 23 on the base 28 will be discussed in detail below. With regard to the bus contacts 23 on the terminal block 23, FIG. 3 specifically illustrates terminal block contacts 33 that have a two-prong fork shape that is configured to mate with receptacles or with another fork on an opposite side of a similar I/O device in accordance with present embodiments. In another embodiment, as illustrated in FIG. 4, the terminal block contacts 33 may include one or more prongs 70 and corresponding receptacles 72. In operation, one or more of the conductive prongs 70 extending from the terminal block 30 of one I/O device 22 may slide between a pair of adjacent prongs or flexible components that define a portion of a receptacle 72 in a terminal block 30 of another I/O device 22.

In the embodiments illustrated in FIGS. 3 and 4, the terminal block 30 is a removable terminal block that may be physically connected and electrically coupled to the base 28 during assembly of the I/O device 22, and physically disconnected and electrically decoupled during disassembly (e.g., for servicing) of the I/O device 22. The removable nature of the illustrated terminal block 30 enables replacement of the I/O module 32 without the need for re-wiring. Further, by employing the bus contacts 23 on the terminal block 30, a device bus (including device buses for each I/O device or component of a control system) of a system including multiple I/O devices 22 may be completed as the terminal blocks 30 are assembled. Indeed, present embodiments can include data and power bus contacts and/or field power contacts located in a removable terminal block such as the terminal block 30 illustrated in FIGS. 3 and 4. By providing such contacts in the terminal block 30 instead of in a module housing, assembly efficiency for the I/O device 22 and access to the device bus is facilitated relative to traditional arrangements. As described above, in other embodiments, the terminal block 30 may be directly integrated with the base 28 and bus contact features (e.g., triple-prong mating feature or spring-loaded ball contacts) in accordance with present embodiments may be utilized. Such integrated embodiments may be desirable, for example, in process automation control applications for which the specific arrangement of electrical connections may be somewhat complex, and the ability to maintain these electrical connections during servicing is of greater importance.

As illustrated, the terminal block 30 includes eight terminals 34 (i.e., channels) for connecting field device wiring to the terminal block 30. Each of the terminals 34 is configured to be associated with a particular input to a field device or output from a field device. As illustrated, each terminal 34 includes a terminal opening 36 into which a field wire electrically connected to a field device may be inserted, and an attachment activator (e.g., a terminal screw) 38, which when activated (e.g., tightened) causes a clamp or other electrical wiring connection mechanism within the terminal block 30 to tighten around an end of a field wire that has been inserted into the associated terminal opening 36. As illustrated, each of the terminals 34 terminates at the back of the terminal block 30 with a terminal block connector 40, which may be inserted into terminal block connector openings 42 in the front of a terminal block bay 44 of the base 28 to physically and communicatively connect the terminal block 30 with the base 28. In the illustrated embodiment, each of the terminal block connectors 40 include two opposing electrical prongs 46 that slide around and electrically connect with a single electrical prong (not shown) in the respective terminal block connector opening 42 of the terminal block bay 44 of the base 28. However, in other embodiments, other types of terminal block connectors 40 may be used to electrically connect with mating electrical connectors in the respective terminal block connector opening 42 of the terminal block bay 44 of the base 28.

The I/O module 32 may also be physically and communicatively connected to the base 28 by inserting the I/O module 32 into a mating slot 48 in an I/O module bay 50 of the base 28. When the I/O module 32 is inserted into the slot 48 in the I/O module bay 50 of the base 28, the I/O module 32 becomes electrically coupled to the terminals 34 of the terminal block 30 via internal circuitry within the base 28 that electrically connects the electrical prongs (or other suitable electrical connectors) in the terminal block connector openings 42 to respective electrical outlets 52 in the front of the I/O module bay 50 of the base 28. The electrical outlets 52 for each channel are in turn electrically coupled to the I/O module 32 via respective electrical connectors (not shown) that, in certain embodiments, extend from the back of the I/O module 32. As such, the terminal block 30, the base 28, and the I/O module 32 are all electrically and communicatively coupled together such that signals to and from the field device to which the I/O device 22 is connected are shared between the terminal block 30, the base 28, and the I/O module 32.

In addition, the I/O device 22 may also be electrically coupled to an I/O adapter 24 electrically upstream, and/or other I/O devices 22 electrically upstream or electrically downstream via electrical coupling features of the I/O device 22. In certain embodiments, components that are coupled electrically upstream of the I/O device 22 are components that are on a left side 54 of the I/O device 22 when viewing the I/O device 22 from the front, and components that are electrically coupled downstream of the I/O device 22 are components that are on a right side 56 of the I/O device 22 when viewing the I/O device 22 from the front. However, in other embodiments, the upstream and downstream electrical coupling features may be configured differently.

In certain embodiments, adjacent I/O devices 22 may be physically attached to each other via one or more connection features (e.g., slots) 58 of the base 28 on one of the sides (e.g., the left side 54 of the illustrated embodiment) of the I/O device 22 near the back of the base 28. Mating connection features such as protrusions (not shown) on the opposite side (e.g., the right side 56 of the illustrated embodiment) of the base 28 of the I/O device 22 near the back of the base 28. In certain embodiments, connection features of an I/O device 22 may slide into mating connection features of an adjacent I/O device 22, thereby physically attaching the adjacent I/O devices 22.

As set forth above, present embodiments may include the device bus contacts 23 on various components of the I/O devices 22 in accordance with present embodiments. For example, data and power bus contacts and/or field power contacts may be located on the terminal block 30, module 32, or on the base 28. In the illustrated embodiment, the base 28 includes bus contacts 23 referred to as system electrical contacts 60 and field electrical contacts 62. When adjacent I/O devices 22 are physically attached to each other, the system electrical contacts 60 on one of the sides (e.g., the left side 54 of the illustrated embodiment) of the base 28 align with and are electrically coupled to mating electrical contacts (not shown) on the base 28 on the opposite side (e.g., the right side 56 of the illustrated embodiment) of an adjacent I/O device 22. Similarly, field electrical contacts 62 on the base 28 on one of the sides (e.g., the left side 54 of the illustrated embodiment) align with and are electrically coupled to mating electrical contacts (not shown) on the base 28 on the opposite side (e.g., the right side 56 of the illustrated embodiment) of an adjacent I/O device 22. In the illustrated embodiment, the I/O device 22 includes five system electrical contacts 60 and two field electrical contacts 62. In accordance with present embodiments, each of these contacts 60, 62 includes a triple-prong or dual-prong fork configured to mate with a corresponding dual-prong fork, as will be discussed in further detail below.

In an embodiment such as that illustrated in FIG. 3, system power may be electrically communicated via electrically connected I/O devices 22 and/or the I/O adapter 24 via two of the system electrical contacts 60, while the three other system electrical contacts 60 are used for transmission of data (e.g., relating to signals transmitted to and from the field devices to which the I/O devices 22 are electrically connected) between the electrically connected I/O devices 22 and the I/O adapter 24. In addition, the two field electrical contacts 62 are used to electrically communicate power to the field devices to which the I/O devices 22 are electrically connected. However, it will be understood that the specific number of system electrical contacts 60 and field electrical contacts 62 may vary between implementations depending on the requirements for power and data transmission of the I/O devices 22. Further, the terminal block contacts 33 may supplement these functions or provide redundancy. Additionally, it will be understood that, in some embodiments, additional terminal block contacts 33 may be provided on the terminal block 30 to completely replace the functionality of the contacts 60, 62 on the base 28 such that the contacts 60, 62 can be excluded.

As illustrated in FIG. 3, in certain embodiments, the I/O module 32 may include a status display 64 on the front face of the I/O module 32 for displaying operating status information of the I/O module 32, the base 28, and the terminal block 30. The status display 64 may, for example, include status light emitting diodes (LEDs) corresponding to each of the terminals 34 of the terminal block 30. Further, in certain embodiments, once the terminal block 30 and the I/O module 32 are physically and communicatively connected to the base 28 of the I/O device 22, a latch 66 or other fastening device extending from the terminal block 30 may further attach the terminal block 30 to the I/O module 32, thereby providing additional structural support and stabilizing the electrical connections between the terminal block 30, the I/O module 32, and the base 28.

Figure 5:
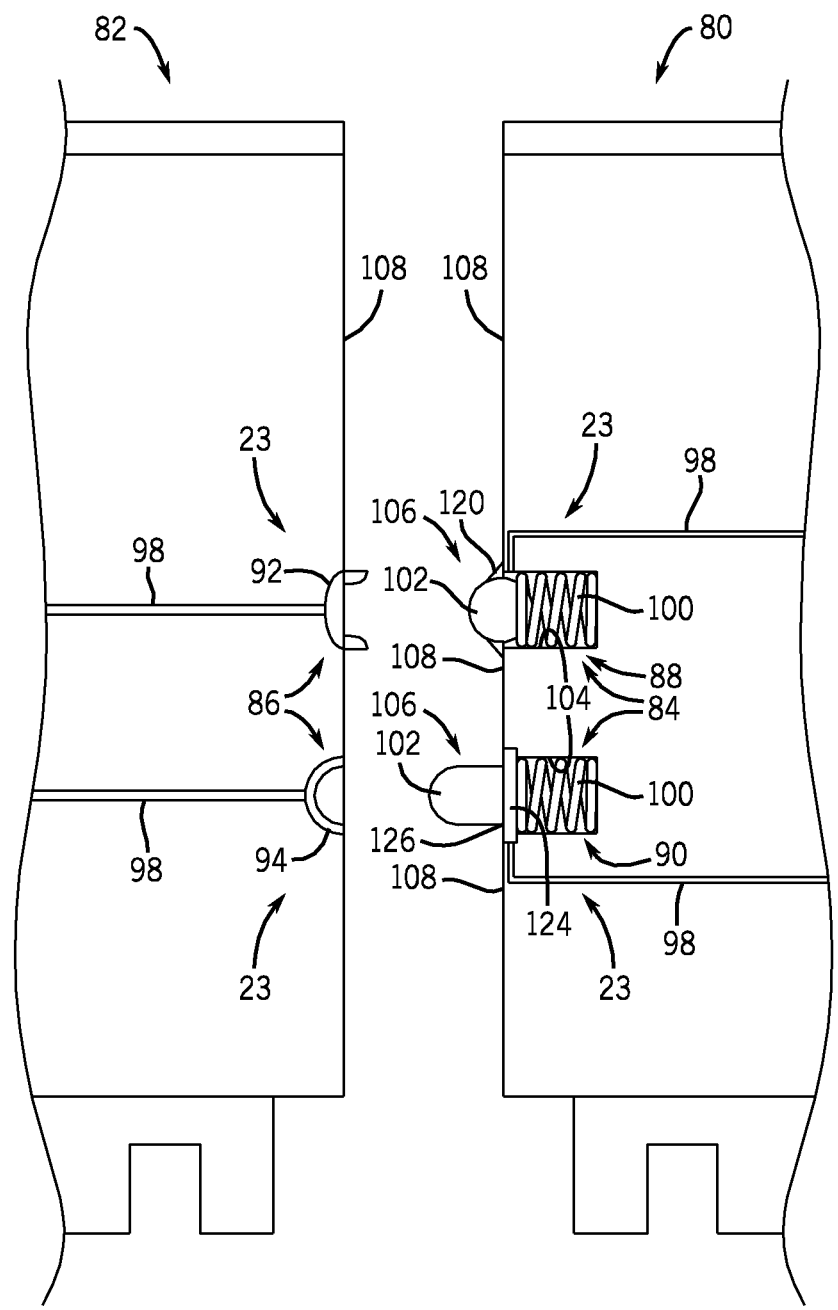
FIG. 5 is a schematic representation of an I/O device including spring-loaded contacts coupled with device bus circuitry and another I/O device including receptacles coupled with device bus circuitry in accordance with embodiments of the present techniques.

FIG. 5 is a schematic cross-sectional view of a first terminal block 80 and a second terminal block 82 that are configured to be communicatively coupled by bus connectors 23 in accordance with present techniques. Each of the terminal blocks 80, 82 includes two different types of bus connectors 23 such that each bus connector 23 of the first terminal block 80 is configured to couple with a corresponding bus connector 23 of the second terminal block 82. As indicated above, the bus connectors 23 may include various different coupling or mating characteristics in accordance with present techniques. In the embodiment illustrated by FIG. 5, the bus connectors 23 include spring-loaded connectors 84 and corresponding receptacles 86. Specifically, the spring-loaded connectors 84 include a spring-loaded ball connector 88 and a spring-loaded plug connector 90, and the receptacles 86 include a raised ball seat 92 and a recess 94. In other embodiments, the spring-loaded connectors 84 may be arranged to electrically couple with other spring-loaded connectors 84 instead of receptacles 86. All of the illustrated bus connectors 23 in FIG. 5 include conductive material communicatively coupled with corresponding circuitry 98 forming segments of a device bus. When the spring loaded connectors 84 are engaged with the receptacles 86, the circuitry 98 coupled to each connector 84 and each receptacle 86 is thus communicatively coupled and merged into a corresponding device bus.

As illustrated in FIG. 5, each of the spring loaded connectors 84 includes a spring 100 and a conductive member 102 disposed within a channel 104. The spring 100 is arranged to bias the conductive member 102 toward an opening 106 at an end of the channel 104. The conductive member 102 is thus capable of extending at least partially out of the opening 106 and beyond an edge of a housing 108 in which the opening 106 is made. The conductive member 102 is prevented from passing completely out of the channel 104 by a retention feature. For example, in the spring-loaded ball connector 88, the conductive member 102 is a ball-shaped member that the spring 100 biases into a ball seat 120 such that a portion of the ball-shaped member and the ball seat 120 act as the retention feature. Thus, a portion of the conductive member 102 of the spring-loaded ball connector 88 is biased beyond an edge of the housing 108 of the first terminal block 80 and such that the conductive member 102 can communicatively couple with the raised ball seat 92 of the second terminal block 82. With regard to the spring-loaded plug connector 90, the conductive member 102 is a plug-shaped member with an extended ridge 124 that the spring 100 biases against a ledge 126 of the opening 106 into the channel 104. The extended ridge 124 and the edge 126 serve as the retention feature for the spring-loaded plug connector 90. As with the spring-loaded ball connector 88, the spring-loaded plug connector 90 functions to bias a portion of the conductive member 102 out of the opening 106 such that the conductive member 102 of the spring-loaded plug connector 90 can engage with the recess 94 to establish a device bus including the circuitry 98 of the first and second terminal blocks 80, 82. It should be noted that in other embodiments, the terminal blocks 80, 82 could be replaced with a different I/O device component, such as two I/O device bases that include one or more bus connectors 23 (e.g., the spring-loaded ball connector 88 or the spring-loaded plug connector 90).

FIG. 6 illustrates coupling features of bus contacts 23 including a pair of two-prong forks in accordance with present embodiments. Specifically, FIG. 6 illustrates a pair of bus contacts 23 coupled together, wherein the bus contacts 23 include a first two-pronged fork 202 engaged with a second two-pronged fork 204. These forks 202, 204 may extend from the base 28, the terminal block 30, or the I/O module 32 of two separate I/O devices 22 and facilitate communicative coupling of device buses in each of the I/O devices 22 to form a unified device bus between the two I/O devices 22. Each of the forks 202, 204 in FIG. 6 includes a pair of curved or sloped prongs 206 with flared tips 208 to facilitate engagement. However, in other embodiments, different shape characteristics of the prongs 206 may be employed. For example, the prongs may be generally straight and rectangular in one embodiment. Further, in the embodiment illustrated by FIG. 6, the prongs 206 of the first two-prong fork 202 are positioned on the outside of the prongs 206 of the second two-prong fork 204 such that first two-prong fork 202 is pressing inwardly on the outer sides of the second two-prong fork 202, which provides a physical and electrical engagement between these two bus contacts 202, 204. Such engagement is facilitated because the second two-prong fork 204 is slightly smaller than the first two-prong fork 202. This engagement may be achieved by sliding the forks 202, 204 together vertically or horizontally.

As noted above, the forks 202, 204 illustrated in FIG. 6, which extend from a device bus of an I/O device component, are sized differently to facilitate engagement. However, in other embodiments, the forks 202, 204 may have essentially identical geometric features. That is, the forks 202, 204 may have the same sized and spaced prongs 206. Further, different coupling configurations may be facilitated by different prong characteristics and arrangements. For example, in one embodiment, the prongs 206 of the forks 202, 204 may be configured to interleave. In yet another embodiment, additional prongs 206 may be added to improve physical and/or electrical coupling. For example, as illustrated in FIG. 7, the bus contacts may include a three-prong fork 210 and a two-prong fork 212. As illustrated in FIG. 7, the three-prong fork 210 includes a pair of curved outer prongs 220 and a straight prong 222 positioned between the outer prongs 220. The two-prong fork 212 includes a pair of curved prongs 224. The two forks 210, 212 in FIG. 7 are coupled together to provide a physical and electrical coupling between corresponding I/O devices in accordance with present embodiments. Specifically, the prongs 224 of the two-pronged fork 212 are positioned about the straight prong 222 and between the curved outer prongs 220 of the three-prong fork 210. Such an arrangement may provide additional strength to the physical coupling of the forks 210, 212, and additional surface area or redundant points of contact for electrical coupling of the forks 210, 212. While the illustrated embodiments include certain physical characteristics (e.g., curvature of the prongs), in other embodiments, the various prongs may have different characteristics. For example, the prongs may be straight and configured to flexibly wedge together in one embodiment.

FIG. 8 is a perspective view of a I/O device module 300 (e.g., base 28, terminal block 30, or I/O module 32) including bus contacts 23 disposed on a non-lateral surface of the I/O device module 300. Specifically, the I/O device module 300 includes a male contact 302 extending from a face 304 of the module 300 and a female contact 306 disposed within an extension 308 offset from the face 304 such that the female contact 306 opens toward a body 310 of the module 300. The face 304 on which the male contact 302 is located may be considered a front-facing panel and the female contact 306 may be considered to be located on a rear-facing panel. The extension 308 is essentially cantilevered from the face 304 in the illustrated embodiment and the rear portion of the extension 308 is the rear-facing panel. This arrangement of the male contact 302 and female contact 306 facilitates communicative coupling of additional I/O device modules positioned adjacent the I/O device module 300. For example, FIG. 9 is a top view of a pair of I/O device modules 300 coupled together in accordance with present embodiments. The bus contacts 23, as illustrated in FIGS. 8 and 9, enable the I/O device modules 300 to be coupled during installation of the I/O device modules by sliding the modules together along lateral surfaces 314. Indeed, the I/O device modules 300 may be coupled together with the same motion (e.g., a motion parallel to a depth dimension 316 of the module 300) involved with installing the I/O device modules 300 on a bus bar or attaching the I/O device modules 300 to other I/O device components. That is, by moving the I/O device modules 300 toward engagement with a bus bar or other module component (e.g., sliding a terminal block into a base), the bus contacts 23 of adjacent modules 300 may become coupled. By positioning the bus contacts 23 on non-lateral surfaces, lateral movement of the I/O device modules 300 may be unnecessary for coupling or decoupling of the bus contacts 23. It should be noted that in other embodiments the male and female contacts 302, 306 may be replaced with other types of contacts (e.g., two-prong forks, three-prong forks, or spring-loaded connectors) in accordance with present embodiments.

Figure 10:
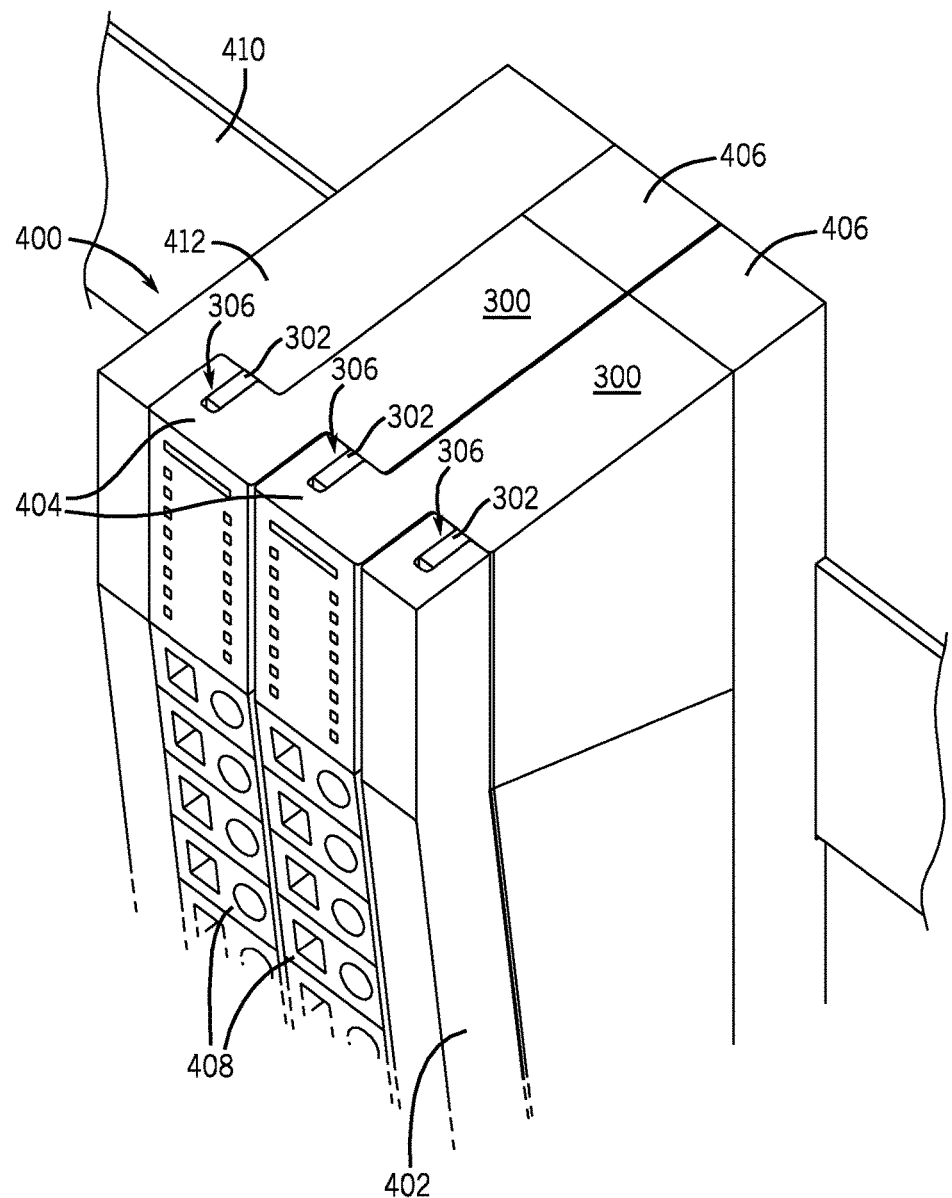
FIG. 10 is a perspective view of an automation control system including a controller and I/O devices coupled via bus contacts on non-lateral surfaces in accordance with embodiments of the present techniques.

As in other embodiments, the male contact 302 and the female contact 306 represent bus contacts 23 that may be utilized to join corresponding device buses to form a single device bus in accordance with present embodiments. Indeed, each of the male and female contacts 302, 306 may be coupled with device bus circuitry. Accordingly, several I/O device modules 300 (and corresponding I/O devices) may be coupled together to establish a single device bus, which may include a power bus or data bus for features of a control system, including field components. When several I/O device modules 300 are coupled together, at least one male contact 302 or female contact 306 may remain uncoupled. Accordingly, as illustrated by the system 400 in FIG. 10, present embodiments may include a cover or blank 402 configured to couple with the otherwise exposed male or female contact 302, 306. Specifically, in the illustrated embodiment, the blank 402 is coupled with a one of the male contacts 302. This may provide protective covering for the male or female contact 302, 306 and prevent inadvertent electrical communication with such an exposed feature. It should be noted that FIG. 10 illustrates the I/O device modules 300 (including the male and female contacts 302, 306) as I/O modules 404 coupled with bases 406 and terminal blocks 408. The bases 406 are engaged with a bus bar 410 and the system 400 includes a controller 412. In other embodiments, bus contacts such as the male and female contacts 302, 306 may be disposed on one or more of the other I/O device components.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. An automation control system, comprising:
a first input/output (I/O) device component;
a first bus connector integrated with the first I/O device component and communicatively coupled with first circuitry within the first I/O device component, wherein the first bus connector comprises a first conductive member biased outward from, and exposed with respect to, a side of the first I/O device component;
a second bus connector integrated with the first I/O device component and communicatively coupled with second circuitry within the first I/O device component, wherein the second bus connector comprises a second conductive member biased outward from the side of the first I/O device component;
a second I/O device component;
a third bus connector integrated with the second I/O device component and communicatively coupled with third circuitry within the second I/O device component, wherein the third bus connector comprises a third conductive member extending outward from, exposed with respect to, and accessible along a side of the second I/O device component and configured to engage the first bus connector; and
a fourth bus connector integrated with the second I/O device component and communicatively coupled with fourth circuitry within the second I/O device component, wherein the fourth bus connector is accessible along the side of the second I/O device component and configured to engage the second bus connector;
wherein the first circuitry, second circuitry, third circuitry, and fourth circuitry are segments of a device bus that is formed when the first bus connector is engaged with the third bus connector and the second bus connector is engaged with the fourth bus connector.

2. The automation control system of claim 1, wherein: the first bus connector comprises a first spring disposed in a first channel within the first I/O device component and configured to bias the first conductive member along the first channel; and
the second bus connector comprises a second spring disposed in a second channel within the first I/O device component and configured to bias the second conductive member along the second channel.

3. The automation control system of claim 2, wherein the first conductive member comprises a ball connector and the second conductive member comprises a plug connector.

4. The automation control system of claim 1, wherein the first bus connector comprises a spring loaded ball connector, wherein the first conductive member comprises a ball connector biased by a spring along a channel within the first I/O device component and retained at least partially within the channel by a ball seat configured to engage the ball connector.

5. The automation control system of claim 4, wherein the second bus connector comprises a spring loaded plug connector, wherein the second conductive member comprises a plug-shaped member biased by an additional spring along an additional channel within the first I/O device component and retained at least partially within the additional channel by an extended ridge of the plug-shaped member engaging a lip of the channel adjacent the side of the first I/O device component.

6. The automation control system of claim 1, wherein the third and fourth bus connectors comprise spring loaded connectors, the third conductive member biased outward from the side of the second I/O device component and the fourth bus connector comprising a fourth conductive member biased outward from the side of the second I/O device component.

7. The automation control system of claim 1, wherein the third bus connector comprises a raised ball seat extending from the side of the second I/O device component.

8. The automation control system of claim 7, wherein the fourth bus connector comprises a recess within the side of the second I/O device component.

9. The automation control system of claim 1, wherein the first I/O device component comprises a first terminal block and the second I/O device component comprises a second terminal block.

10. The automation control system of claim 1, wherein the first I/O device component comprises a first I/O device base and the second I/O device component comprises a second I/O device base.

11. An input/output (I/O) device component comprising:
a first bus connector communicatively coupled with first circuitry within the I/O device component, wherein the first bus connector comprises a first conductive member biased outward from a first side of the I/O device component;
a second bus connector communicatively coupled with second circuitry within the I/O device component, wherein the second bus connector comprises a second conductive member biased outward from the first side of the first I/O device component;
a third bus connector communicatively coupled with the first circuitry, wherein the third bus connector is accessible along a second side of the I/O device component opposite the first side, wherein the third bus connector comprises a raised ball seat extending from the second side; and
a fourth bus connector communicatively coupled with the second circuitry, wherein the fourth bus connector is accessible along the second side.

12. The I/O device component of claim 11, wherein:
the first bus connector comprises a first spring disposed in a first channel within the I/O device component and configured to bias the first conductive member along the first channel; and
the second bus connector comprises a second spring disposed in a second channel within the I/O device component and configured to bias the second conductive member along the second channel.

13. The I/O device component of claim 12, wherein the first conductive member comprises a ball connector and the second conductive member comprises a plug connector.

14. The I/O device component of claim 11, wherein the third and fourth bus connectors comprise spring loaded connectors, the third bus connector comprising a third conductive member biased outward from the second side and the fourth bus connector comprising a fourth conductive member biased outward from the second side.

15. The I/O device component of claim 11, wherein the fourth bus connector comprises a recess within the second side.

16. The I/O device component of claim 11, wherein the I/O device component is a terminal block or an I/O device base.

* * * * *